(12) United States Patent
Suganuma et al.

(10) Patent No.: US 9,852,885 B2
(45) Date of Patent: Dec. 26, 2017

(54) CHARGED PARTICLE BEAM WRITING METHOD, AND CHARGED PARTICLE BEAM WRITING APPARATUS

(71) Applicant: NuFlare Technology, Inc., Yokohama-shi (JP)

(72) Inventors: Mizuna Suganuma, Yokohama (JP); Noriaki Nakayamada, Kamakura (JP)

(73) Assignee: NuFlare Technology, Inc., Yokohama-shi (JP)

( * ) Notice: Subject to any disclaimer, the term of this patent is extended or adjusted under 35 U.S.C. 154(b) by 0 days.

(21) Appl. No.: 15/450,235

(22) Filed: Mar. 6, 2017

(65) Prior Publication Data
US 2017/0278672 A1   Sep. 28, 2017

(30) Foreign Application Priority Data
Mar. 25, 2016  (JP) .................................. 2016-062227

(51) Int. Cl.
| H01J 37/304 | (2006.01) |
| H01J 37/317 | (2006.01) |
| H01J 37/147 | (2006.01) |
| H01J 37/20 | (2006.01) |

(52) U.S. Cl.
CPC .......... *H01J 37/304* (2013.01); *H01J 37/147* (2013.01); *H01J 37/20* (2013.01); *H01J 37/3174* (2013.01); *H01J 2237/2001* (2013.01)

(58) Field of Classification Search
USPC ....................................... 250/492.22, 492.23
See application file for complete search history.

(56) References Cited

U.S. PATENT DOCUMENTS

| 6,677,089 B2 * | 1/2004 | Ogino ................ H01J 37/3026 |
| | | 430/296 |
| 9,224,578 B2 | 12/2015 | Nakayamada et al. |
| 2017/0047194 A1 * | 2/2017 | Yoshikawa ............ H01J 37/20 |

FOREIGN PATENT DOCUMENTS

JP          2014-209599          11/2014

* cited by examiner

*Primary Examiner* — Kiet T Nguyen
(74) *Attorney, Agent, or Firm* — Oblon, McClelland, Maier & Neustadt, L.L.P.

(57) ABSTRACT

A charged particle beam writing method includes acquiring a pair of a reference dose and a backscatter coefficient for proximity effect correction using a first settling time, acquiring a first relation between a temperature rise amount and a critical dimension variation amount using a second settling time shorter than the first settling time, the backscatter coefficient and the reference dose acquired, calculating a temperature correction parameter depending on a temperature rise amount, for correcting a dose, by using the first relation, and a second relation on a dose and a pattern critical dimension in a case of using the first settling time, calculating a beam irradiation dose by the reference dose and a dose coefficient obtained from the backscatter coefficient of the pair acquired, and the temperature correction parameter, and writing a pattern with a beam based on the dose calculated using the second settling time.

10 Claims, 8 Drawing Sheets

CHARGED PARTICLE BEAM WRITING METHOD, AND CHARGED PARTICLE BEAM WRITING APPARATUS

CROSS-REFERENCE TO RELATED APPLICATION

This application is based upon and claims the benefit of priority from the prior Japanese Patent Application No. 2016-062227 filed on Mar. 25, 2016 in Japan, the entire contents of which are incorporated herein by reference.

BACKGROUND OF THE INVENTION

Field of the Invention

Embodiments of the present invention relate generally to a charged particle beam writing method, and a charged particle beam writing apparatus, and more specifically relate to a method and an apparatus that perform a proximity effect correction and a resist heating correction, for example.

Description of Related Art

The lithography technique that advances miniaturization of semiconductor devices is extremely important as a unique process whereby patterns are formed in semiconductor manufacturing. In recent years, with high integration of LSI, the line width (critical dimension) required for semiconductor device circuits is decreasing year by year. For forming a desired circuit pattern on such semiconductor devices, a master or "original" pattern (also called a mask or a reticle) of high accuracy is needed. Thus, the electron beam (EB) writing technique, which intrinsically has excellent resolution, is used for producing such a high-precision master pattern.

Figure 10:
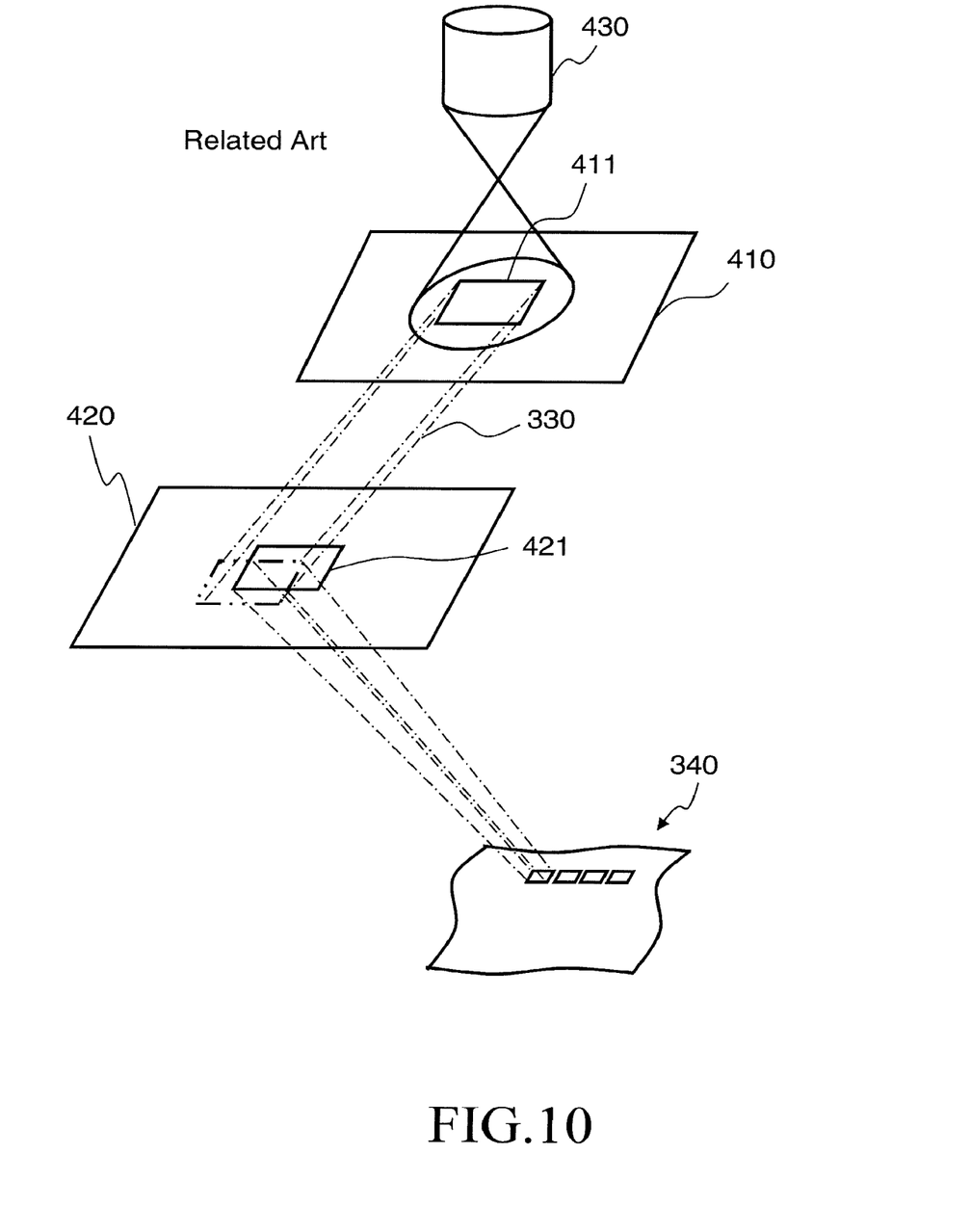
FIG. 10 is a conceptual diagram explaining operations of a variable-shaped electron beam writing apparatus.

FIG. 10 is a conceptual diagram explaining operations of a variable-shaped electron beam writing or "drawing" apparatus. The variable-shaped electron beam writing apparatus operates as described below. A first aperture plate 410 has a quadrangular (rectangular) aperture 411 for shaping an electron beam 330. A second aperture plate 420 has a variable shape aperture 421 for shaping the electron beam 330 having passed through the aperture 411 of the first aperture plate 410 into a desired quadrangular shape. The electron beam 330 emitted from a charged particle source 430 and having passed through the aperture 411 is deflected by a deflector to pass through a part of the variable shape aperture 421 of the second aperture plate 420, and thereby to irradiate a target object or "sample" 340 placed on a stage which continuously moves in one predetermined direction (e.g., x direction) during writing. In other words, a quadrangular shape that can pass through both the aperture 411 of the first aperture plate 410 and the variable shape aperture 421 of the second aperture plate 420 is used for pattern writing in a writing region of the target object 340 on the stage continuously moving in the x direction. This method of forming a given shape by letting beams pass through both the aperture 411 of the first aperture plate 410 and the variable shape aperture 421 of the second aperture plate 420 is referred to as a variable shaped beam (VSB) system.

With the development of the optical lithography technology, and the wavelength reduction (shorter wavelength) due to EUV, the number of electron beam shots required for mask writing is acceleratedly increasing. On the other hand, for ensuring the line width accuracy needed for micropatterning, it has been aimed to reduce shot noise and pattern edge roughness by making resist less sensitive and increasing the dose. Thus, since the number of shots and the amount of dose increase limitlessly, the pattern writing time also increases limitlessly. Therefore, it is now considered/examined to reduce the writing time by increasing the current density.

However, if the substrate is irradiated with an increased amount of irradiation energy as higher density electron beams in a short time, another problem occurs in that the substrate overheats resulting in a phenomenon called "resist heating" of changing the resist sensitivity and degrading the line width accuracy.

On the other hand, in the electron beam writing, when writing a circuit pattern by irradiating a mask, which is coated with resist, with electron beams, a phenomenon called a "proximity effect" occurs due to backscattering of the electron beams penetrating the resist film, reaching the layer thereunder to be reflected, and entering the resist film again. Thereby, a dimensional change (variation) occurs, that is, a written pattern is deviated from a desired dimension. In order to avoid this phenomenon, a proximity effect correction operation that suppresses such dimensional change (variation) by modulating the dose is for example performed in the writing apparatus.

However, even if the dose has been adjusted by the proximity effect correction operation, if subsequently a temperature correction operation is performed for dose modulation in order to suppress dimensional change (variation) due to the resist heating described above, there arises another problem in that a correction residual error occurs in the proximity effect correction. In other words, in performing a resist heating correction, since the dose which is set for obtaining a target dimension after correcting the resist heating is different from the dose which was assumed/ estimated at the time of the proximity effect correction, the pattern critical dimension (CD) obtained after the resist heating correction is deviated from the target dimension. In order to cope with this problem, it can be thought to again perform a proximity effect correction calculation, but, it may result in throughput degradation. Further, it will be necessary to newly devise a method for a proximity effect correction calculation to be performed for the second time. For example, there is disclosed a method of calculating a polynomial including a dose modulation coefficient as an element based on a region representative temperature which increases by heat transfer due to irradiation of electron beams, and repeating the calculation until the difference between a value obtained by calculating the polynomial and a dose threshold value becomes within an allowable value (for example, refer to Japanese Patent Application Laid-open No. 2014-209599). Thus, it is desired that a correction residual error can be eliminated even if no second proximity effect correction calculation is performed.

BRIEF SUMMARY OF THE INVENTION

According to one aspect of the present invention, a charged particle beam writing method includes acquiring a pair of a reference dose and a backscatter coefficient for correcting a proximity effect in a case of using a charged particle beam whose shot position is moved after a first settling time has passed; acquiring a first relation between a temperature rise amount and a critical dimension variation amount of a pattern formed using a charged particle beam, whose shot position is moved after a second settling time shorter than the first settling time has passed, and whose dose for correcting the proximity effect is acquired using the backscatter coefficient and the reference dose of the pair acquired; calculating a temperature correction parameter depending on a temperature rise amount, for correcting a dose, by using the first relation, and a second relation on a dose and a pattern critical dimension formed by the charged particle beam whose shot position is moved after the first settling time has passed; calculating a dose of beam irradiation by using the reference dose and a dose coefficient for correcting the proximity effect, obtained from the backscatter coefficient of the pair acquired, and the temperature correction parameter; and writing a pattern on a target object, using a charged particle beam based on the dose calculated, while shifting a shot position after the second settling time has passed.

According to another aspect of the present invention, a charged particle beam writing apparatus includes processing circuitry that is programmed to perform the function of a first acquisition processing part acquiring a pair of a reference dose and a backscatter coefficient for correcting a proximity effect in a case of using a charged particle beam whose shot position is moved after a first settling time has passed, a second acquisition part acquiring a first relation between a temperature rise amount and a critical dimension variation amount of a pattern formed using a charged particle beam, whose shot position is moved after a second settling time shorter than the first settling time has passed, and whose dose for correcting the proximity effect is acquired using the backscatter coefficient and the reference dose of the pair acquired, a temperature correction parameter calculation processing part calculating a temperature correction parameter depending on a temperature rise amount, for correcting a dose, by using the first relation, and a second relation on a dose and a pattern critical dimension formed by the charged particle beam whose shot position is moved after the first settling time has passed, and a dose calculation processing part calculating a dose of beam irradiation by using the reference dose and a dose coefficient for correcting the proximity effect, obtained from the backscatter coefficient of the pair acquired, and the temperature correction parameter; and a writing mechanism configured to include a stage for mounting a target object thereon, an emission source for emitting a charged particle beam, and a deflector for deflecting the charged particle beam, and to write a pattern on the target object with the charged particle beam of the dose while shifting a shot position after the second settling time has passed.

DETAILED DESCRIPTION OF THE INVENTION

First Embodiment

A first embodiment of the present invention describes a writing method and apparatus that can execute a proximity effect correction and a resist heating correction without again performing calculation for the proximity effect correction.

In the first embodiment, there will be described a configuration in which an electron beam is used as an example of a charged particle beam. The charged particle beam is not limited to the electron beam, and other charged particle beam such as an ion beam may also be used. Moreover, a writing apparatus of a variable shaped beam type will be described as an example of a charged particle beam apparatus.

Figure 1:
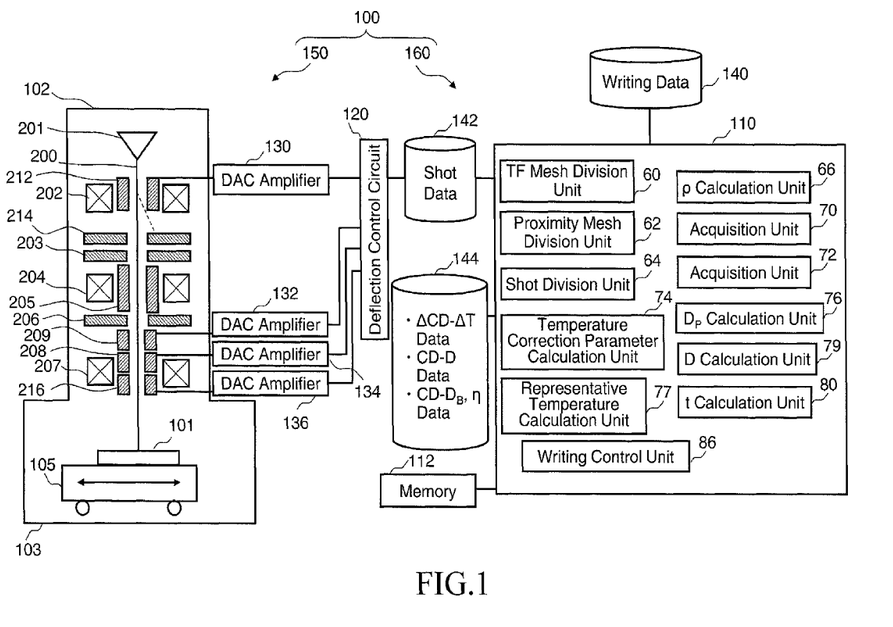
FIG. 1 is a schematic diagram showing a configuration of a writing apparatus according to the first embodiment.

FIG. 1 is a schematic diagram showing a configuration of a writing apparatus according to the first embodiment. In FIG. 1, a writing apparatus 100 includes a writing mechanism 150 and a control system circuit 160. The writing apparatus 100 is an example of a charged particle beam writing apparatus, and particularly, an example of a variable shaped beam (VSB) writing apparatus. The writing mechanism 150 includes an electron optical column 102 and a writing chamber 103. In the electron optical column 102, there are arranged an electron gun 201 (emission source), an illumination lens 202, a blanking deflector (blanker) 212, a blanking aperture substrate 214, a first shaping aperture substrate 203, a projection lens 204, a deflector 205, a second shaping aperture substrate 206, an objective lens 207, a main deflector 208, a sub deflector 209, and sub-sub deflector 216. In the writing chamber 103, there is arranged an XY stage 105 that is movable at least in the x-y direction. On the XY stage 105, there is placed a target object 101 (substrate) serving as a writing target on which resist has been applied. The target object 101 is an exposure mask, a silicon wafer, and the like used for manufacturing semiconductor devices. The mask may be, for example, a mask blank.

The control system circuit 160 includes a control computer unit 110, a memory 112, a deflection control circuit 120, a DAC (digital-analog converter) amplifier units 130, 132, 134 and 136 (deflection amplifiers), and storage devices 140, 142, and 144 such as magnetic disk drives. The control computer unit 110, the deflection control circuit 120, and the storage device 140 are connected with each other through a bus (not shown). The deflection control circuit 120 is connected to the DAC amplifier units 130, 132, 134 and 136. The DAC amplifier unit 130 is connected to the blanking deflector 212. The DAC amplifier unit 132 is connected to the sub deflector 209. The DAC amplifier unit 134 is connected to the main deflector 208. The DAC amplifier unit 136 is connected to the sub-sub deflector 216.

In the control computer unit 110, there are arranged a TF mesh division unit 60 for dividing into TF meshes, a proximity mesh division unit 62 for dividing into proximity meshes, a shot division unit 64 for dividing into shots, a ρ calculation unit 66, an acquisition unit 70, an acquisition unit 72, a temperature correction coefficient calculation unit 74 (temperature correction parameter calculation unit), a proximity effect correction irradiation coefficient Dp calculation unit 76, a representative temperature calculation unit 77, a dose D calculation unit 79, an irradiation time t calculation unit 80, and a writing control unit 86. Each of the "units" such as the TF mesh division unit 60 for dividing into TF meshes, the proximity mesh division unit 62 for dividing into proximity meshes, the shot division unit 64 for dividing into shots, the ρ calculation unit 66, the acquisition unit 70, the acquisition unit 72, the temperature correction coefficient calculation unit 74, the proximity effect correction irradiation coefficient Dp calculation unit 76, the representative temperature calculation unit 77, the dose D calculation unit 79, the irradiation time t calculation unit 80, and the writing control unit 86 includes a processing circuitry. As the processing circuitry, for example, an electric circuit, a computer, a processor, a circuit board, a quantum circuit, or a semiconductor device may be used. Each of the "units" may use a common processing circuitry (same processing circuitry), or different processing circuitries (separate processing circuitries). Data which is input and output to/from the TF mesh division unit 60 for dividing into TF meshes, the proximity mesh division unit 62 for dividing into proximity meshes, the shot division unit 64 for dividing into shots, the ρ calculation unit 66, the acquisition unit 70, the acquisition unit 72, the temperature correction coefficient calculation unit 74, the proximity effect correction irradiation coefficient Dp calculation unit 76, the representative temperature calculation unit 77, the dose D calculation unit 79, the irradiation time t calculation unit 80, and the writing control unit 86, and data being operated are stored in the memory 112 each time. It is preferable that computers such as a plurality of CPUs or a plurality of GPUs are arranged for the "unit (s)" which requires a large amount of calculation.

Writing data is input from the outside of the writing apparatus 100 and stored in the storage device 140.

FIG. 1 shows a configuration necessary for explaining the first embodiment. Other configuration elements generally necessary for the writing apparatus 100 may also be included.

Figure 2:
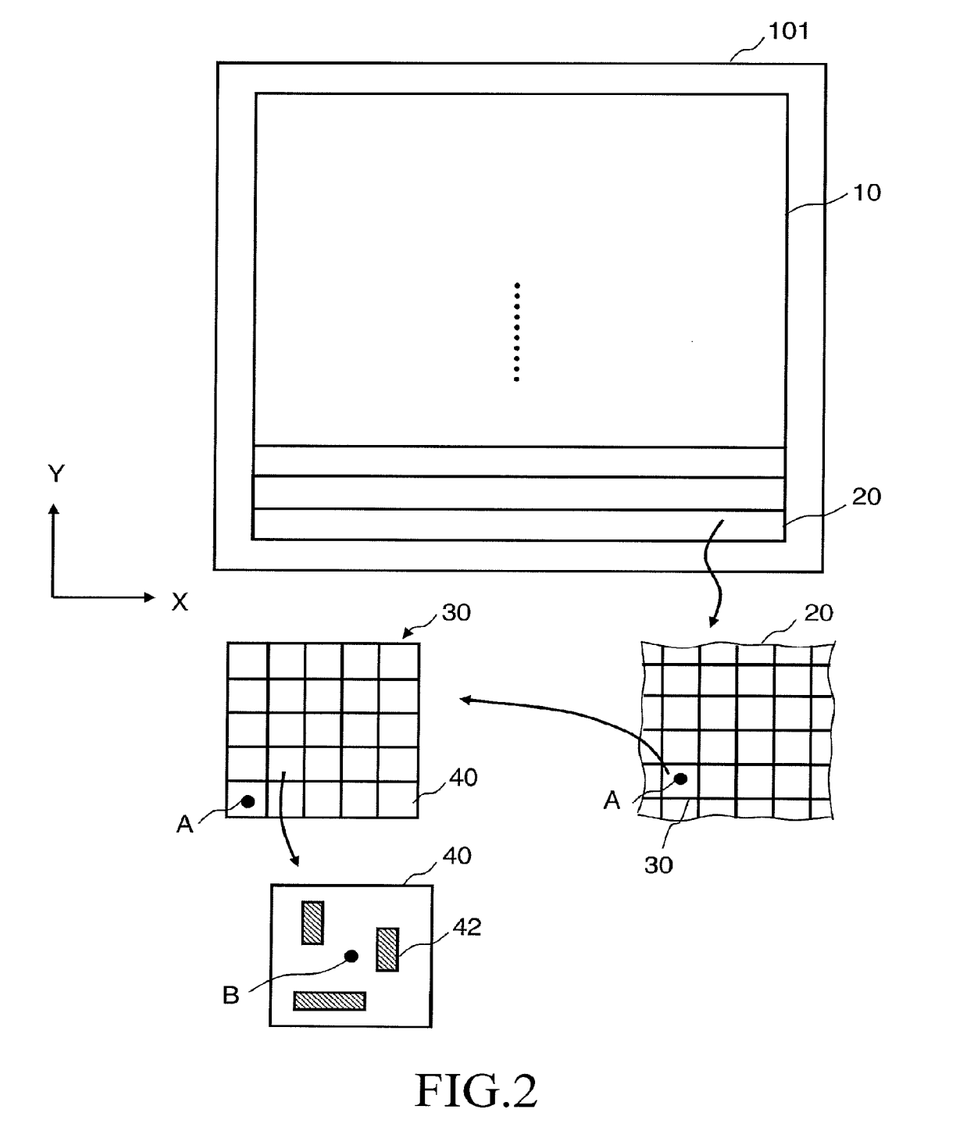
FIG. 2 is a conceptual diagram for explaining each region according to the first embodiment.

FIG. 2 is a conceptual diagram for explaining each region according to the first embodiment. In FIG. 2, a writing region 10 of the target object 101 is virtually divided into a plurality of strip-shaped stripe regions 20, which are arrayed along the y direction, for example, by the width deflectable by the main deflector 208. Then, each of the stripe regions 20 is virtually divided into a plurality of mesh-like subfields (SFs) 30 (small regions) by the size deflectable by the sub deflector 209. Further, each of the SFs 30 is virtually divided by the size deflectable by the sub-sub deflector 216 into a plurality of mesh-like under subfields (USFs) 40 (small regions), where the USF is referred to as "TF" being an abbreviation of Tertiary Field which herein indicates the third deflection region. A shot figure is written at a shot position 42 in each TF 40. It is preferable for the number of divided TFs in each SF to be a number at the level where a writing operation is not limited (controlled) by calculation of a representative temperature of TF. For example, it is preferable to be ten or less in length and width, and it is further preferable to be five or less in length and width.

A digital signal for blanking control is output from the deflection control circuit 120 to the DAC amplifier unit 130. Then, in the DAC amplifier unit 130, the digital signal is converted to an analog signal and amplified to be applied as a deflection voltage to the blanking deflector 212. An electron beam 200 is deflected by this deflection voltage so as to form a beam of each shot.

A digital signal for main deflection control is output from the deflection control circuit 120 to the DAC amplifier 134. Then, in the DAC amplifier 134, the digital signal is converted to an analog signal and amplified to be applied as a deflection voltage to the main deflector 208. The electron beam 200 is deflected by this deflection voltage, and thereby each shot beam is deflected to a reference position of a predetermined subfield (SF) in the virtually divided mesh like SFs.

A digital signal for sub deflection control is output from the control circuit 120 to the DAC amplifier 132. Then, in the DAC amplifier 132, the digital signal is converted to an analog signal and amplified to be applied as a deflection voltage to the sub deflector 209. The electron beam 200 is deflected by this deflection voltage, and thereby each shot beam is deflected to a reference position of an under subfield (TF) being a minimum deflection region in a mesh shape obtained by further virtually dividing a predetermined mesh-like subfield (SF) which has been obtained by virtual division.

A digital signal for sub-sub deflection control is output from the deflection control circuit 120 to the DAC amplifier unit 136. Then, in the DAC amplifier 136, the digital signal is converted to an analog signal and amplified to be applied as a deflection voltage to the sub-sub deflector 216. The electron beam 200 is deflected by this deflection voltage, and thereby each shot beam is deflected to a corresponding shot position in an under subfield (TF) being a minimum deflection region in a mesh shape obtained by further virtually dividing a predetermined mesh-like subfield (SF) which has been obtained by virtual division.

The writing apparatus 100 performs writing processing for each stripe region 20 by using a multiple stage deflector. Here, as an example, a three-stage deflector composed of the main deflector 208, the sub deflector 209, and the sub-sub deflector 216 is used. While the XY stage 105 is continuously moving in the −x direction, for example, writing is performed in the x direction in the first stripe region 20. After the writing has been finished in the first stripe region 20, writing is carried out in the same direction or in the opposite direction in the second stripe region 20. Then, in the same way, writing is performed in the third and subsequent stripe regions 20. The main deflector 208 (first deflector) sequentially deflects the electron beam 200 to a reference position A of the SF 30 such that the movement of the XY stage 105 is followed. The sub deflector 209 (second deflector) deflects the electron beam 200 from the reference position A of each SF 30 to a reference position B of the TF 40. Further, the sub-sub deflector 216 (the third deflector) deflects the electron beam 200 from the reference position B of each TF 40 to the shot position 42 of a beam irradiating the TF 40 concerned. Thus, the sizes of the deflection regions of the main deflector 208, the sub deflector 209, and the sub-sub deflector 216 are different from each other. The TF 40 is the minimum one of the deflection regions of the multiple stage deflectors.

Figure 3:
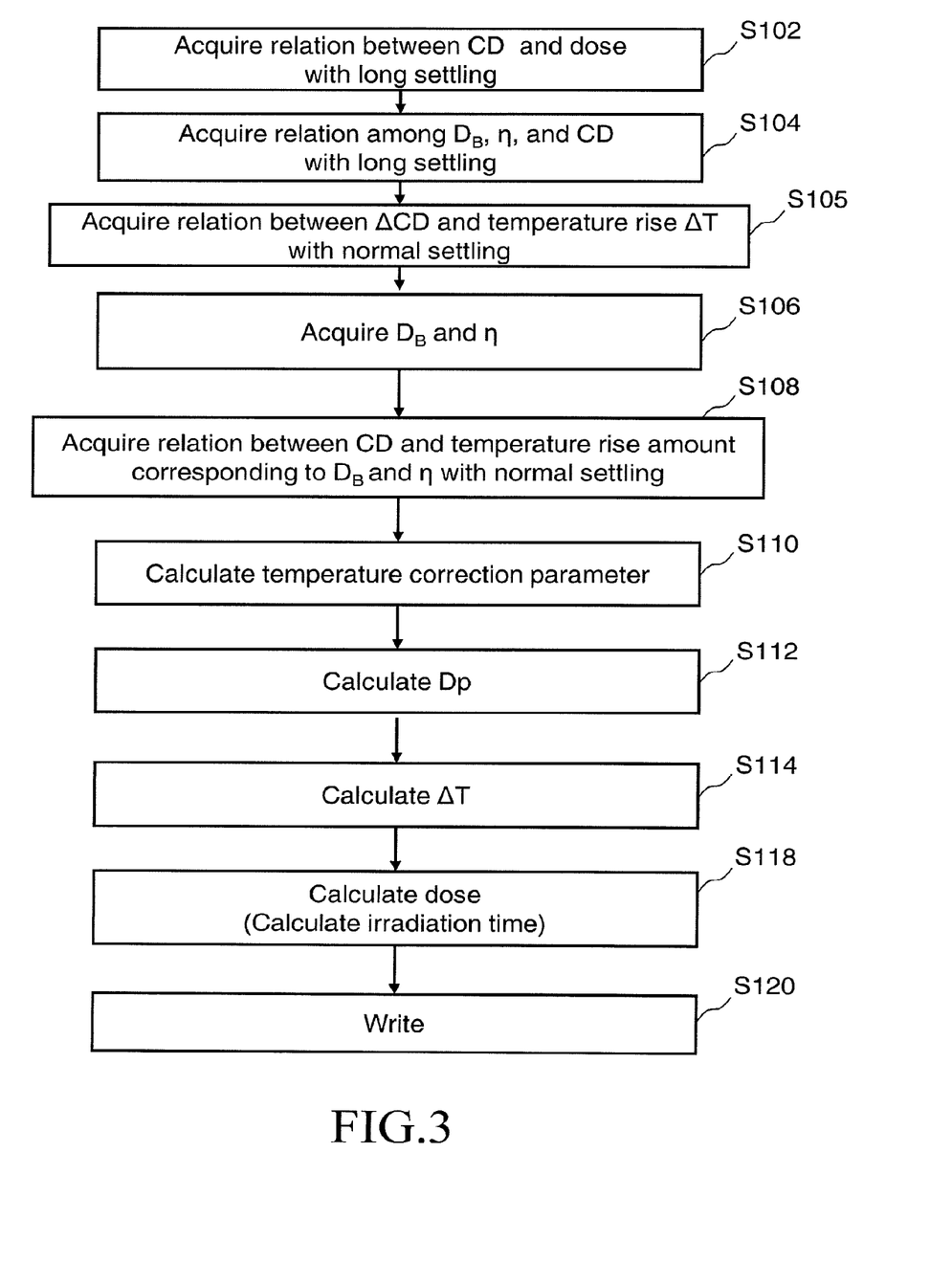
FIG. 3 is a flowchart showing main steps of a writing method according to the first embodiment.

FIG. 3 is a flowchart showing main steps of a writing method according to the first embodiment. As shown in FIG.

3, the writing method of the first embodiment executes a series of steps: a relation acquisition step (S102) for acquiring relation between CD and dose in the case of long settling time, a relation acquisition step (S104) for acquiring relation among $D_B$, $\eta$, and CD in the case of long settling time, a relation acquisition step (S105) for acquiring relation between critical dimension variation amount $\Delta$CD and temperature rise $\Delta$T in the case of normal settling time, a $D_B$ and $\eta$ acquisition step (S106), a relation acquisition step (S108) for acquiring relation between CD and temperature rise amount in the case of normal settling time, a temperature correction parameter calculation step (S110), a proximity effect correction dose coefficient Dp(x) calculation step (S112), a representative temperature calculation step (S114), a dose (irradiation time) calculation step (S118), and a writing step (S120).

Figure 4A:
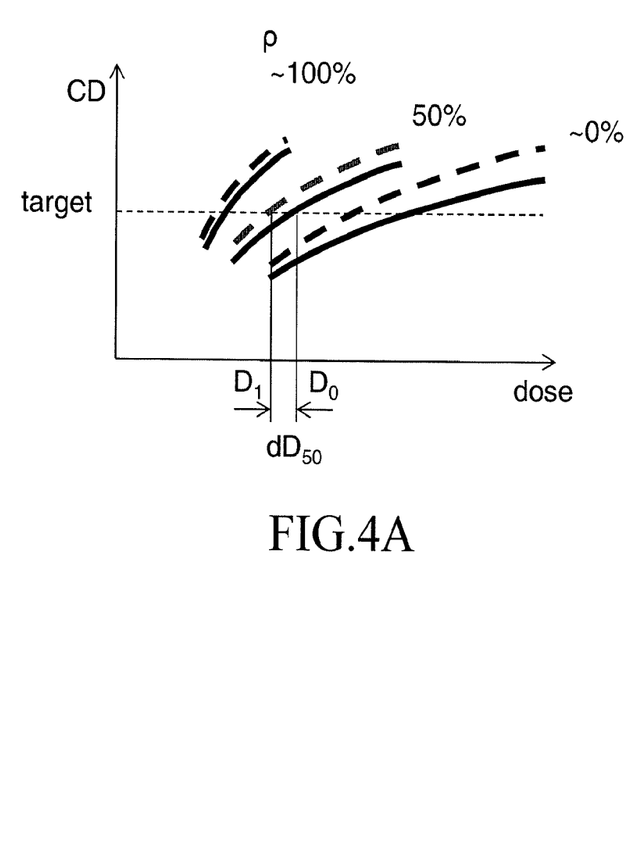
FIGS. 4A and 4B show examples of a relation between a pattern critical dimension (CD) and a dose according to the first embodiment.
Figure 4B:
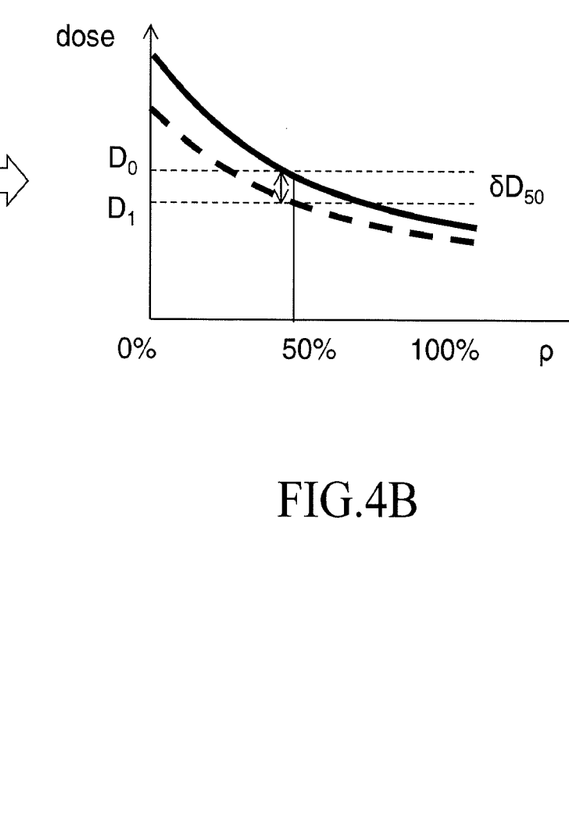

FIGS. 4A and 4B show examples of a relation between a pattern critical dimension (CD) and a dose according to the first embodiment. In FIG. 4A, the ordinate represents a pattern critical dimension (CD), and the abscissa does the dose of a beam. FIG. 4A shows examples of a relation between the pattern critical dimension (CD) and the dose under the condition affected by resist heating, and the condition where the effect of resist heating can be disregarded. In electron beam writing, a DAC amplifier is used for applying a deflection voltage to a deflector which deflects a beam to a desired position. In order to drive the DAC amplifier, it is necessary to have a stabilization time (settling time) until the deflection voltage has been stabilized. Therefore, for performing a next shot after a certain shot, it is needed to wait for the elapse of the settling time. On the other hand, resist heating is caused by a temperature rise due to heat transfer from the surroundings. However, since heat dissipation is provided at the same time, when a certain time passes, the temperature rise due to heat transfer from the surroundings will be ignorable. Then, if having a long settling time at the level where the temperature rise due to heat transfer from the surrounding region can be disregarded, it becomes possible to disregard pattern dimension variation due to resist heating. In other words, the long settling time (first settling time) is set to be the time within which pattern dimension variation due to heat transfer from the surrounding region does not occur. In FIGS. 4A and 4B, the graph (dotted line) shows the case of the condition which is affected by resist heating when a pattern is formed by electron beam irradiation with a normal settling time. The graph (continuous line) shows the case of condition where, by electron beam irradiation with a long settling time, the effect of resist heating can be disregarded when a pattern is formed. The normal settling time indicates the time at the level where pattern position deviation or/and pattern dimension deviation resulting from shortage of the settling time does not occur. Shorter settling time can make the shot cycle shorter, thereby improving the throughput. Therefore, the normal settling time is preferably to be as short as possible in the extent of the time at the level where pattern position deviation or/and pattern dimension deviation resulting from shortage of the settling time does not occur. However, according to the first embodiment, the normal settling time is defined within the time affected by resist heating.

For example, when a pattern having an area density of 50% is written, an error of $\delta D_{50}$ occurs between a dose $D_1$ for obtaining a target critical dimension (CD) in the case of writing under the condition affected by resist heating, and a dose $D_0$ for obtaining a target critical dimension (CD) in the case of writing under the condition where the effect of resist heating can be disregarded. By using the results of FIG. 4A of writing patterns having area densities of 0% (approximately), 50%, and 100% individually, FIG. 4B shows a relation between the dose and the pattern area density.

Figure 5A:
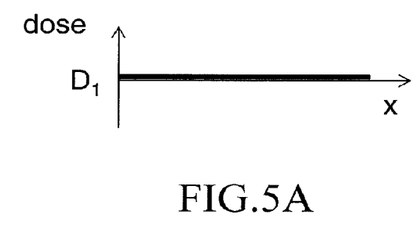
FIGS. 5A to 5D show examples of a dose change and a pattern critical dimension (CD) change, which are depending on the position, according to the first embodiment.
Figure 5B:
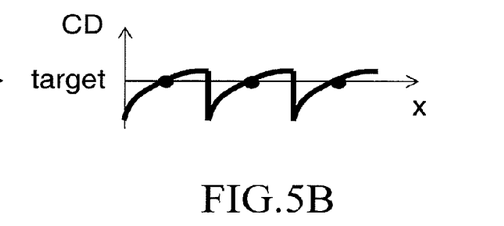
Figure 5C:
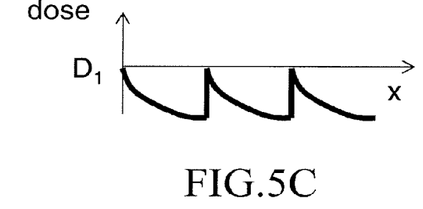
Figure 5D:
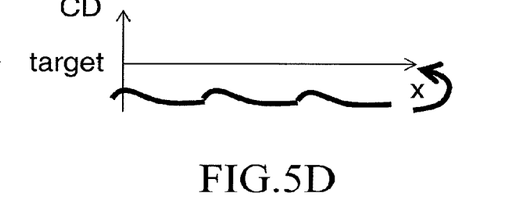

FIGS. 5A to 5D show examples of a dose change and a pattern critical dimension (CD) change, which are depending on the position, according to the first embodiment. FIG. 5A shows the case of writing, concerning the pattern area density of 50% shown in FIG. 4A, patterns sequentially in a plurality of SFs 30 with the dose $D_1$ with a normal settling time while performing beam deflection. Since the writing is carried out with the fixed dose $D_1$, even if the position changes, no dose change occurs. When performing writing with the dose $D_1$ with a normal settling time while providing beam deflection, the written pattern critical dimension (CD) changes due to the effect of resist heating as shown in FIG. 5B. The pattern critical dimension (CD) to be written in the same SF 30 becomes large because the temperature rises by heat transfer from the TF 40 in which writing has already been finished. Then, the heat is dissipated during the settling time in moving between the SFs 30, and therefore, the pattern critical dimension (CD) to be written becomes small at the writing start time of a next SF 30. Thus, as the writing progresses in the same SF 30, since the temperature rises due to the heat transfer from TF 40 in which writing has already been finished, the pattern critical dimension (CD) to be written becomes large. This phenomenon is repeated. Therefore, in order to correct the error of the pattern critical dimension (CD) to be written, the dose is corrected such that the dose $D_1$ is gradually reduced by performing resetting, for example, for each SF 30 as shown in FIG. 5C (temperature effect correction). However, if this correction is performed, the pattern critical dimension (CD) to be written becomes smaller in whole than a desired target dimension as shown in FIG. 5D.

Figure 6A:
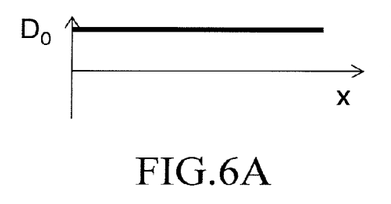
FIGS. 6A to 6D show examples of a dose change and a pattern critical dimension (CD) change, which are depending on the position, according to the first embodiment.
Figure 6B:
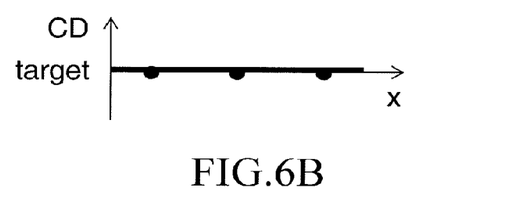
Figure 6C:
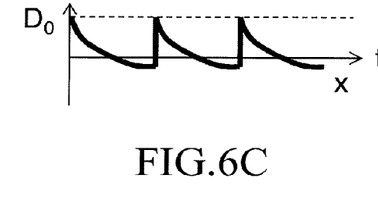
Figure 6D:
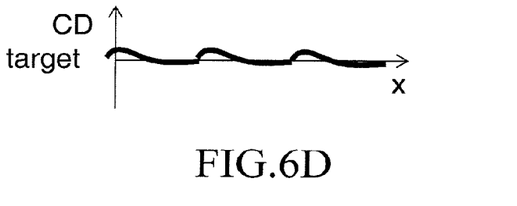

FIGS. 6A to 6D show examples of a dose change and a pattern critical dimension (CD) change, which are depending on the position, according to the first embodiment. FIG. 6A shows the case of writing, concerning the pattern area density of 50%, patterns sequentially in a plurality of SFs 30 with the dose $D_0$ shown in FIG. 4A larger than the dose $D_1$ with a long settling time while performing beam deflection. Since the writing is carried out with the fixed dose $D_0$, even if the position changes, no dose change occurs. When performing writing with the dose $D_0$ with a long settling time while providing beam deflection, the written pattern critical dimension (CD) can be formed in a desired target dimension because the effect of resist heating can be ignored as shown in FIG. 6B. Then, after offsetting the beam dose from $D_1$ to $D_0$ in the case of writing with a normal settling time while performing beam deflection, the dose is corrected such that the dose $D_0$ is gradually reduced by performing resetting, for example, for each SF 30 as shown in FIG. 6C (temperature effect correction). Thereby, as shown in FIG. 6D, the pattern critical dimension (CD) is offset to be larger in whole than the CD shown in FIG. 5D so as to be close to a desired target dimension.

For offsetting the beam dose from $D_1$ to $D_0$, a reference dose $D_B$ should be increased. Therefore, according to the first embodiment, it is necessary to calculate a reference dose $D_B$ based on which the target critical dimension (CD) can be obtained with a long settling time making the effect of resist heating ignored, and to calculate a backscatter coefficient $\eta$ (proximity effect correction coefficient) paired with the reference dose $D_B$. In addition to perform a proximity effect correction using the backscatter coefficient $\eta$, a temperature correction parameter accompanied with the temperature rise due to heat transfer from the surroundings is calculated. Then, using the temperature correction parameter, a temperature effect correction is performed for the dose which has been obtained by performing a proximity effect correction to the reference dose $D_B$.

In the relation acquisition step (S102), the relation between a CD and a dose in the case of writing with a long settling time is acquired using an evaluation pattern.

Figure 7:
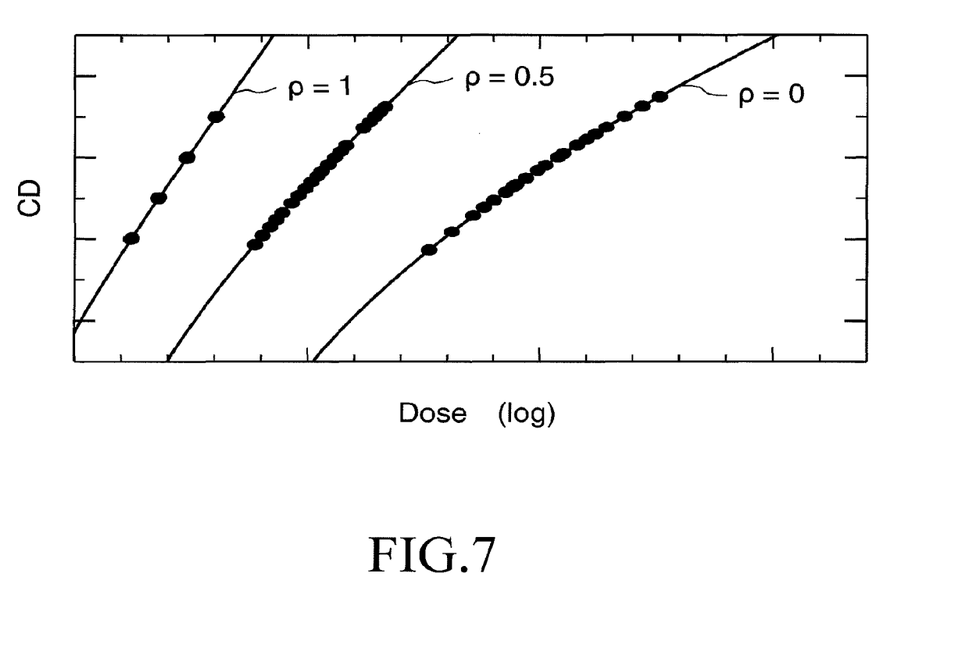
FIG. 7 is a graph showing an example of correlation data between a pattern critical dimension (CD) and a dose D in the case of writing with a long settling time according to the first embodiment.

FIG. 7 is a graph showing an example of correlation data between a pattern critical dimension (CD) and a dose D in the case of writing with a long settling time according to the first embodiment. The ordinate represents a pattern critical dimension (CD), and the abscissa represents a dose D expressed in logarithm. Here are shown the results obtained by experiment with respect to the pattern densities $\rho(x)=0$ (0%), 0.5 (50%), and 1 (100%), for example. The pattern density $\rho(x)$ to be set is not limited to 0%, 50%, and 100%. For example, it is also preferable to use one of less than or equal to 10%, 50%, and one of greater than or equal to 90%. Moreover, it is not limited to densities of three types, and also preferable to use other types for measuring. For example, densities of four or greater than four types may also be used. As described above, the correlation between the pattern critical dimension (CD) and the dose D in the case of writing with a long settling time is calculated to generate correlation information data (CD-D data). The generated CD-D data is input from the outside of the writing apparatus 100, and stored in the storage device 144. The pattern density $\rho(x)$ may be defined using a proximity effect density $U(x)$. The proximity effect density $U(x)$ is defined as a value obtained by calculating a convolution integral of $\rho(x)$ and a distribution function in the proximity effect influence range.

In the relation acquisition step (S104), the relation among a backscatter coefficient $\eta$, a reference dose $D_B$, and a CD in the case of writing with a long settling time is acquired using an evaluation pattern. An evaluation pattern is written while making the backscatter coefficient $\eta$ variable for each of a plurality of reference doses $D_B$.

Figure 8:
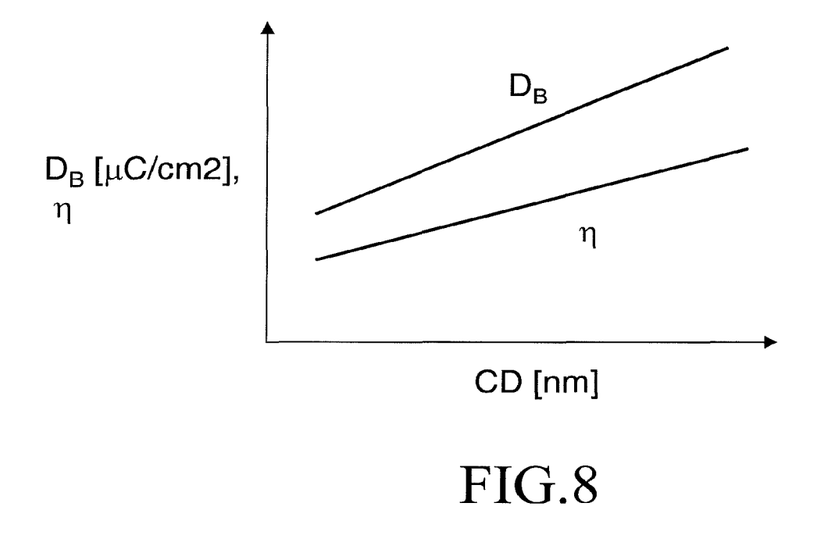
FIG. 8 is a graph showing an example of correlation data on a pattern critical dimension CD, a backscatter coefficient $\eta$, and a reference dose $D_B$ according to the first embodiment.

FIG. 8 is a graph showing an example of correlation data on a pattern critical dimension CD, a backscatter coefficient $\eta$, and a reference dose $D_B$ according to the first embodiment. There exists a backscatter coefficient $\eta$ by which a critical dimension CD can be corrected to be a specified critical dimension irrespective of a pattern density $\rho(x)$ in the case of using a reference dose $D_B$. FIG. 8 shows the correlation data between the $\eta$ and $D_B$ based on which the specified critical dimension CD can be obtained. Thus, for each reference dose $D_B$, there is a backscatter coefficient $\eta$ by which a proximity effect correction can be performed with high accuracy. As described above, the correlation between a pattern critical dimension (CD) and a reference dose $D_B$, and the correlation between a pattern critical dimension (CD) and a backscatter coefficient $\eta$ are calculated to generate correlation information (CD-($D_B$,$\eta$) data). The generated CD-($D_B$, $\eta$) data is input from the outside of the writing apparatus 100, and stored in the storage device 144.

In the relation acquisition step (S105), the relation between a critical dimension variation amount $\Delta CD$ and a temperature rise $\Delta T$ in the case of writing with a normal settling time is acquired using an evaluation pattern.

Figure 9:
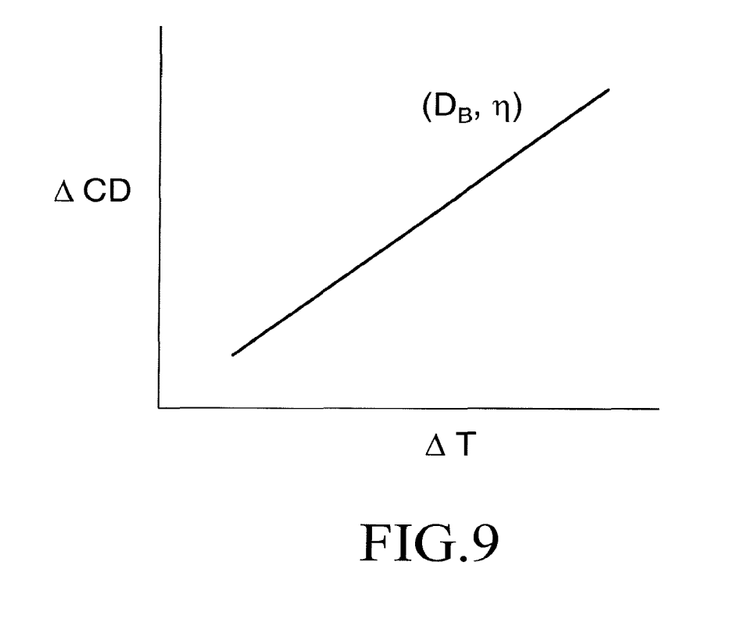
FIG. 9 is a graph showing an example of correlation data between a critical dimension variation amount $\Delta CD$ and a temperature rise $\Delta T$ according to the first embodiment.

FIG. 9 is a graph showing an example of correlation data between a critical dimension variation amount $\Delta CD$ and a temperature rise $\Delta T$ according to the first embodiment. The correlation data between a critical dimension variation amount $\Delta CD$ and a temperature rise $\Delta T$ is acquired for each pair of $D_B$ and $\eta$.

For example, in each TF 40 as a unit region for calculating a temperature, a temperature rise occurs due to heat transfer from a plurality of TFs 40, the number of which is n, having been written before the TF 40 concerned is written. Thereby, the dimension of the evaluation pattern to be written in the TF 40 concerned changes. Therefore, by continuously advancing writing sequentially, the amount of pattern dimension variation in each of a plurality of TFs 40 each having a different temperature rise can be obtained. The temperature rise amount $\Delta T$ (representative temperature $T(x, t)$) of each TF 40 can be approximated by the following equation (1).

$$T(x,t)=\iint \rho(x')D(x')H(x-x',t-t')dx'dt' \quad (1)$$

In the equation (1), the representative temperature $T(x, t)$ is defined using the pattern area density $\rho(x)$, the dose $D(x)$, and the thermal diffusion kernel $H(x, t)$. The thermal diffusion kernel $H(x, t)$ shown in the equation (1) can be defined by the following equation (2), for example.

$$H(x-x', t-t') = \frac{E}{Gd \cdot Cp \cdot Rg} \text{erf}\left(\frac{Rg}{2K\sqrt{t-t'}}\right)\frac{1}{4\pi K^2(t-t')}\exp\left\{-\frac{(x-x')^2}{4K^2(t-t')}\right\} \quad (2)$$

In the equation (2), E denotes an electron beam energy [keV], Gd denotes a gram density [g/cm$^3$] of the substrate material, and Cp denotes a specific heat [V(K·g)] of the substrate material. Rg, so-called Grun range, indicates an average range approximation in the depth direction when an electron beam of energy E[keV] is vertically incident on the substrate material of a gram density Gd[g/cm$^3$], and is represented as $Rg=(0.046/Gd) \cdot E^{1.75}$[μm]. The thermal diffusion coefficient K is defined as $K^2[(mm)^2/s]=\lambda/(Gd \cdot Cp)$. Here, $\lambda$ denotes the thermal conductivity [W/(K·m)] of the substrate material. Moreover, when calculating the equation (4) to be described later, a value denoted by a unit [fC/μm$^2$] (fC=femto coulomb) is used for D(x')/N. erf( ) denotes an error function.

The representative temperature $T(x, t)$ is based on, for each TF 40, heat transfer from a plurality of TFs 40, the number of which is n, having been written before the TF 40 concerned is written. Therefore, the representative temperature Ti of the TF concerned can be calculated by cumulatively adding each temperature rise amount $\delta Tij$ due to heat transfer from a plurality of TFs 40, the number of which is n, having been written before the TF 40 concerned is written. The temperature rise amount $\delta Tij$ denotes the amount of temperature rise of the i-th TFi caused by heat transfer from the other j-th TFj. The temperature rise amount $\delta Tij$ depends on an elapsed time (ti−tj) from the time tj at which the other TF was written to the time ti at which the TF concerned is written. Therefore, the representative temperature Ti of the TF 40 concerned (i-th TF), that is $T(x, t)$ of the i-th TF 40, is defined as a function of the position x and the time t. The thermal diffusion kernel $H(x, t)$ is defined such that the contents described above are satisfied by the equation (1).

As described above, by plotting the dimension variation amount $\Delta CD$ of the pattern critical dimension (CD) with respect to each temperature rise $\Delta T$(representative temperature Ti), the correlation between the critical dimension variation amount $\Delta CD$ and the temperature rise $\Delta T$ is calculated to generate correlation information ($\Delta CD$-$\Delta T$ data). The generated $\Delta CD$-$\Delta T$ data is input from the outside of the writing apparatus 100, and stored in the storage device 144. The ΔCD-ΔT data may be obtained not by experiment but by simulation etc.

Writing processing is started after preparing each correlation data described above beforehand.

First, the TF mesh division unit 60 (first mesh division unit) virtually divides the writing region of the target object 101 into a plurality of mesh-like TFs 40 (first mesh region) by the size (first mesh size) which can be deflected by the sub-sub deflector 216. Here, the stripe region 20 is first divided into a plurality of mesh-like SFs 30, and then, each SF 30 is virtually divided into a plurality of mesh-like TFs 40. According to the first embodiment, each TF 40 is used as a mesh region for temperature correction calculation.

The shot division unit 64 for dividing into shots reads out writing data from the storage device 140, and performs, for each pass, data conversion processing of several steps in order to generate apparatus-specific shot data unique to the writing apparatus 100. The file structure of the writing data is formed, for example, for each frame region obtained by virtually dividing the chip region of a writing target chip into strip-like regions. The shot division unit 64 reads the data file for each frame region in sequence to generate shot data. Moreover, although a plurality of figure patterns are arranged in a chip, the size which can be formed by one beam shot is restricted in the writing apparatus 100. Therefore, each figure pattern is divided, in the data conversion processing, into shot figures each having a size that can be formed by one beam shot. A figure type, figure size, position, and the like of each shot figure are generated as shot data. The shot data is stored in sequence in the storage device 142.

Moreover, the proximity mesh division unit 62 (second mesh division unit) virtually divides the writing region of the target object 101 into a plurality of proximity meshes (second mesh region). With respect to the size of the proximity mesh, it is preferable to be about ⅒ of the influence radius of the proximity effect, such as about 0.5 μm to 1 μm.

The ρ calculation unit 66 calculates, for each proximity mesh, an area density ρ of a figure pattern arranged in a proximity mesh concerned. Then, the ρ calculation unit 66 generates an area density map by using each mesh value.

In the $D_B$ and η acquisition step (S106), the acquisition unit 70 (first acquisition unit) acquires a pair of a reference dose $D_B$ and a backscatter coefficient η for correcting a proximity effect in the case of using the electron beam 200 whose shot position is moved after a long settling time (first settling time) has passed. Specifically, the acquisition unit 70 reads out (refers to) CD-($D_B$, n) data from the storage device 144, and acquires a pair of a backscatter coefficient 11 and a reference dose $D_E$ with which a target critical dimension (CD) can be obtained when performing writing with a long settling time.

In the relation acquisition step (S108) for acquiring a relation between a CD and a temperature rise amount corresponding to $D_B$ and η in the case of a normal settling time, the acquisition unit 72 (second acquisition unit) acquires ΔCD-ΔT data (first relation) on a temperature rise amount ΔT and a critical dimension variation amount ΔCD of a pattern formed using an electron beam, whose shot position is moved after a normal settling time (second settling time) shorter than the long settling time has passed, and whose dose is a dose for correcting the proximity effect, acquired using the backscatter coefficient q and the reference dose $D_B$ of the acquired pair. Specifically, the acquisition unit 72 reads out ΔCD-ΔT data corresponding to the acquired pair of the backscatter coefficient η and the reference dose $D_B$ from the storage device 144.

In the temperature correction parameter calculation step (S110), the temperature correction parameter calculation unit 74 calculates a temperature correction parameter DT depending on a temperature rise amount, for correcting a dose, by using ΔCD-ΔT data, and CD-D data (second relation) on a dose D and a pattern critical dimension (CD) formed by an electron beam whose shot position is moved after a long settling time (first settling time) has passed. Specifically, the temperature correction parameter calculation unit 74 reads out CD-D data. Then, the temperature correction parameter calculation unit 74 calculates a gradient of the variation amount ΔCD of a pattern critical dimension (CD) to a dose change ΔDose, which is ΔCD/ΔD. The temperature correction parameter calculation unit 74 calculates, for each pattern density, a temperature correction parameter k'(ρ). The temperature correction parameter k'(ρ) can be defined by the following equation (3). If the resolution characteristic becomes different, the value of the temperature correction parameter k'(ρ) varies. Therefore, the temperature correction parameter k'(ρ) is preferably calculated for each of several resist materials having different resolution to the exposure amount.

$$k'(\rho)=(\Delta CD/\Delta T)/(\Delta CD/\Delta D)_\rho=(\Delta D/\Delta T)_\rho \quad (3)$$

In the proximity effect correction dose coefficient Dp(x) calculation step (S112), the Dp calculation unit 76 calculates a proximity effect correction dose coefficient Dp(x) for correcting a proximity effect by using an acquired backscatter coefficient η. Employing a dose model which uses a dose threshold Dth, the Dp calculation unit 76 calculates, for each proximity mesh region, a proximity effect correction dose coefficient Dp(x) of an electron beam with respect to which the proximity effect is corrected. As a dose formula of the dose model using a dose threshold Dth, the following equation (4) can be defined. The equation (4) includes, as terms, a dose threshold Dth, a proximity effect correction dose coefficient Dp(x), a pattern area density ρ(x), and a distribution function G(x). x represents a position (vector). In other words, the two-dimensional coordinates are expressed only by the notation x. By performing interation (repetitive operation) of the equation (4), an unknown proximity effect correction dose coefficient Dp(x) is calculated.

$$\frac{D_p(x)}{2} + \int \rho(x')D_p(x')G(x-x')dx' = Dth \quad (4)$$

In the representative temperature calculation step (S114), the representative temperature calculation unit 77 calculates, for each TF 40 (minimum deflection region), a representative temperature T(x,t) (temperature rise amount ΔT(x)) of the TF 40 concerned increased by heat transfer due to irradiation of the electron beam. The representative temperature T(x,t) (temperature rise amount ΔT) of each TF 40 can be calculable by the equations (1) and (2) described above.

The dose D(x) at each position of the equation (1) is calculated as a product of the reference dose $D_B$ and the proximity effect correction dose coefficient Dp(x) of the acquired pair. It is more preferable to use a dose calculated by subtracting a correction dose, which is obtained by multiplying the representative temperature T(x,t) (temperature rise amount ΔT(x)) of the TF concerned by a temperature correction parameter k'(ρ), from a product of the reference dose $D_B$ and the proximity effect correction dose coefficient Dp(x). By this, each temperature rise amount δTij generated by heat transfer from a plurality of surrounding TFs 40 can be calculated with great accuracy.

In the dose (irradiation time) calculation step (S118), the dose D(x) of beam irradiation is calculated using the reference dose $D_B$ and the proximity effect correction dose coefficient Dp(x) (dose coefficient for correcting proximity effect) obtained from the backscatter coefficient η of the acquired pair, and a temperature correction parameter k'(ρ). The dose D(x) can be defined by the following equation (5).

$$D(x)=D_B \cdot D_p(x) - k'(\rho) \cdot \Delta T(x) \quad (5)$$

Next, the irradiation time t calculation unit 80 calculates an irradiation time t (x) for each shot. The irradiation time t (x) can be calculated by dividing the dose D(x) by a current density J. The data of the obtained irradiation time t (x) is stored in the storage device 142 as a part of shot data.

In the writing step (S120), the writing control unit 86 controls the writing mechanism 150 through the deflection control circuit 120, etc., and starts writing processing. The writing mechanism 150 writes a pattern on the target object 101, using the electron beam based on the calculated dose D(x), while shifting the shot position after a normal settling time has passed. Specifically, it operates as described below. The deflection control circuit 120 refers to the data of the irradiation time t (x) stored in the storage device 142, and acquires an irradiation time for each shot. Then, the deflection control circuit 120 outputs a digital signal which controls the irradiation time of each shot to the DAC amplifier unit 130. The DAC amplifier unit 130 converts the digital signal to an analog signal and amplifies it to be applied as a deflection voltage to the blanking deflector 212.

With respect to the electron beam 200 emitted from the electron gun 201 (emitter), when passing through the blanking deflector 212, it is controlled to pass through the blanking aperture substrate 214 by the blanking deflector 212 when in the beam ON state, and the whole of the beam is deflected to be blocked by the blanking aperture substrate 214 when in the beam OFF state. The electron beam 200 that has passed through the blanking aperture substrate 214 during the period from changing a beam OFF state to a beam ON state to changing the beam ON state to a beam OFF state serves as one shot of the electron beam. The blanking deflector 212 controls the direction of the passing electron beam 200 to alternately generate a beam ON state and a beam OFF state. For example, when in a beam ON state, no voltage is applied to the blanking deflector 212, and, when in a beam OFF state, a voltage should be applied to it. The dose per shot of the electron beam 200 to irradiate the target object 101 is adjusted depending upon the irradiation time of each shot.

Each shot of the electron beam 200, generated by passing through the blanking deflector 212 and the blanking aperture substrate 214 as described above, irradiates the whole of the first shaping aperture substrate 203 which has a quadrangular opening by the illumination lens 202. At this stage, the electron beam 200 is first shaped to a quadrangle. Then, after passing through the first shaping aperture substrate 203, the electron beam 200 of the first aperture image is projected onto the second shaping aperture substrate 206 by the projection lens 204. The first aperture image on the second shaping aperture substrate 206 is deflection-controlled by the deflector 205 so as to change (variably shape) the shape and size of the beam. Such variable beam shaping is performed for each shot, and each shot is generally shaped to have a different shape and size. Then, after passing through the second shaping aperture substrate 206, the electron beam 200 of the second aperture image is focused by the objective lens 207, and deflected by the multistage of the main deflector 208, the sub deflector 209, and the sub-sub deflector 216 (a plurality of deflectors) to reach a desired position on the target object 101 placed on the XY stage 105 which moves continuously. As described above, a plurality of shots of the electron beam 200 are deflected in order, by each deflector, onto the target object 101 serving as a substrate.

As described above, according to the first embodiment, it is possible to simultaneously perform proximity effect correction and resist heating correction without again executing proximity effect correction calculation. Therefore, pattern writing can be performed with high dimension accuracy.

As described above, according to the first embodiment, it is possible to suppress a correction residual error of the proximity effect and a pattern dimensional change (variation) due to resist heating while efficiently performing calculation so that the correction calculation speed may not be slower than the writing speed. Therefore, pattern writing can be performed with high dimension accuracy.

Embodiments have been explained referring to specific examples described above. However, the present invention is not limited to these specific examples.

While the apparatus configuration, control method, and the like not directly necessary for explaining the present invention are not described, some or all of them can be selectively used on a case-by-case basis when needed. For example, although description of the configuration of the control unit for controlling the writing apparatus 100 is omitted, it should be understood that some or all of the configuration of the control unit can be selected and used appropriately when necessary.

In addition, any other charged particle beam writing method and charged particle beam writing apparatus that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A charged particle beam writing method comprising:
   acquiring a pair of a reference dose and a backscatter coefficient for correcting a proximity effect in a case of using a charged particle beam whose shot position is moved after a first settling time has passed;
   acquiring a first relation between a temperature rise amount and a critical dimension variation amount of a pattern formed using a charged particle beam, whose shot position is moved after a second settling time shorter than the first settling time has passed, and whose dose for correcting the proximity effect is acquired using the backscatter coefficient and the reference dose of the pair acquired;
   calculating a temperature correction parameter depending on a temperature rise amount, for correcting a dose, by using the first relation, and a second relation on a dose and a pattern critical dimension formed by the charged particle beam whose shot position is moved after the first settling time has passed;

calculating a dose of beam irradiation by using the reference dose and a dose coefficient for correcting the proximity effect, obtained from the backscatter coefficient of the pair acquired, and the temperature correction parameter; and writing a pattern on a target object, using a charged particle beam based on the dose calculated, while shifting a shot position after the second settling time has passed.

2. The method according to claim 1, wherein the charged particle beam used for writing is deflected by multistage of a plurality of deflectors whose deflection regions have different sizes, further comprising:

calculating, for each minimum deflection region of minimum deflection regions into which a writing region of the target object is divided using a minimum size of the different sizes, a representative temperature of a minimum deflection region concerned which is increased by heat transfer due to irradiation of the charged particle beam, wherein the dose is calculated further using the representative temperature of the minimum deflection region concerned.

3. The method according to claim 1, wherein the temperature correction parameter is calculated for each of a plurality of resist materials having different resolution to an exposure amount.

4. The method according to claim 1, wherein the first settling time is set to be a time with which a pattern dimension variation due to heat transfer from a surrounding region can be disregarded.

5. The method according to claim 4 further comprising:

acquiring the second relation between a pattern critical dimension CD and a dose in a case of writing with the first settling time, using an evaluation pattern.

6. The method according to claim 5, further comprising:

acquiring a relation among the reference dose, the backscatter coefficient, and the pattern critical dimension CD in the case of writing with the first settling time, using the evaluation pattern.

7. The method according to claim 1, wherein the second settling time is set to be a time with which a pattern critical dimension variation occurs due to heat transfer from a surrounding region.

8. The method according to claim 7, further comprising:

acquiring a relation between a critical dimension variation amount $\Delta CD$ and a temperature rise $\Delta T$ in a case of writing with the second settling time, using an evaluation pattern.

9. The method according to claim 8, wherein, while making the pair of the reference dose and the backscatter coefficient variable, correlation data on the critical dimension variation amount $\Delta CD$ and the temperature rise $\Delta T$ is acquired for each of pairs of the reference dose and the backscatter coefficient.

10. A charged particle beam writing apparatus comprising:

processing circuitry that is programmed to perform the function of a first acquisition processing part acquiring a pair of a reference dose and a backscatter coefficient for correcting a proximity effect in a case of using a charged particle beam whose shot position is moved after a first settling time has passed, a second acquisition part acquiring a first relation between a temperature rise amount and a critical dimension variation amount of a pattern formed using a charged particle beam, whose shot position is moved after a second settling time shorter than the first settling time has passed, and whose dose for correcting the proximity effect is acquired using the backscatter coefficient and the reference dose of the pair acquired, a temperature correction parameter calculation processing part calculating a temperature correction parameter depending on a temperature rise amount, for correcting a dose, by using the first relation, and a second relation on a dose and a pattern critical dimension formed by the charged particle beam whose shot position is moved after the first settling time has passed, and a dose calculation processing part calculating a dose of beam irradiation by using the reference dose and a dose coefficient for correcting the proximity effect, obtained from the backscatter coefficient of the pair acquired, and the temperature correction parameter; and a writing mechanism configured to include a stage for mounting a target object thereon, an emission source for emitting a charged particle beam, and a deflector for deflecting the charged particle beam, and to write a pattern on the target object with the charged particle beam of the dose while shifting a shot position after the second settling time has passed.

* * * * *